(12) United States Patent
Mizusaki et al.

(10) Patent No.: US 11,856,873 B2
(45) Date of Patent: Dec. 26, 2023

(54) VARIABLE RESISTANCE MEMORY DEVICE

(71) Applicant: Samsung Electronics Co., Ltd., Suwon-si (KR)

(72) Inventors: Soichiro Mizusaki, Suwon-si (KR); Doyoon Kim, Hwaseong-si (KR); Seyun Kim, Seoul (KR); Yumin Kim, Seoul (KR); Jinhong Kim, Seoul (KR); Youngjin Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 230 days.

(21) Appl. No.: 17/395,040

(22) Filed: Aug. 5, 2021

(65) Prior Publication Data
US 2022/0302380 A1  Sep. 22, 2022

(30) Foreign Application Priority Data

Mar. 17, 2021 (KR) .................. 10-2021-0034862

(51) Int. Cl.
*H10N 70/20* (2023.01)
*H10B 63/00* (2023.01)
*H10N 70/00* (2023.01)

(52) U.S. Cl.
CPC ............. *H10N 70/24* (2023.02); *H10B 63/34* (2023.02); *H10B 63/845* (2023.02); *H10N 70/8833* (2023.02)

(58) Field of Classification Search
CPC .. H10N 70/24; H10N 70/8833; H10N 70/826; H10N 70/253; H10B 63/34; H10B 63/845; H10B 63/80; G11C 2213/15; G11C 2213/71; G11C 2213/74; G11C 13/003; G11C 2213/75; G11C 2213/79; G11C 13/0007
See application file for complete search history.

(56) References Cited

U.S. PATENT DOCUMENTS

| | | | |
|---|---|---|---|
| 9,099,300 B2 | 8/2015 | Kim et al. | |
| 10,224,374 B2* | 3/2019 | Hirayama | .......... G11C 13/0069 |
| 10,930,847 B2* | 2/2021 | Yamaguchi | ........ G11C 13/0028 |
| 2019/0088318 A1 | 3/2019 | Morooka | |
| 2019/0393270 A1 | 12/2019 | Kim | |
| 2021/0202833 A1 | 7/2021 | Kim et al. | |
| 2021/0202840 A1 | 7/2021 | Kim et al. | |
| 2022/0020818 A1 | 1/2022 | Kim et al. | |

OTHER PUBLICATIONS

Qi Liu et al., 'Improvement of Resistive Switching Properties in $ZrO_2$-Based ReRAM With Implanted Ti Ions' *IEEE Electron Drive Letters*, vol. 30, No. 12. Dec. 2009, pp. 1335-1337.

* cited by examiner

*Primary Examiner* — Allison Bernstein
(74) *Attorney, Agent, or Firm* — Harness, Dickey & Pierce, P.L.C.

(57) ABSTRACT

A variable resistance memory may include first and second conductive elements spaced apart from each other on a variable resistance layer. The variable resistance layer may include first to third oxide layers sequentially arranged in a direction perpendicular to a direction in which the first and second conductive elements are arranged. A dielectric constant of the second oxide layer may be greater than dielectric constants of the first and third oxide layers.

20 Claims, 18 Drawing Sheets

FIG. 7

| Sample | | $Al_2O_3$ thickness (nm) | $HfO_2$ thickness (nm) | $Al_2O_3$ thickness (nm) | OnOff ratio |
|---|---|---|---|---|---|
| COMPARATIVE EXAMPLE 1 | $HfO_2$ | 0 | 10 | 0 | 6 |
| COMPARATIVE EXAMPLE 2 | $Al_2O_3$ | 0 | 0 | 10 | 500 |
| COMPARATIVE EXAMPLE 3 | $HfO_2 / Al_2O_3$ | 0 | 1 | 10 | 1000 |
| EMBODIMENT 1 | $Al_2O_3 / HfO_2 / Al_2O_3$ | 1 | 1 | 10 | 2500 |
| EMBODIMENT 2 | $Al_2O_3 / HfO_2 / Al_2O_3$ | 1 | 0.5 | 10 | 3600 |

VARIABLE RESISTANCE MEMORY DEVICE

CROSS-REFERENCE TO RELATED APPLICATION

This application is based on and claims priority under 35 U.S.C. § 119 to Korean Patent Application No. 10-2021-0034862, filed on Mar. 17, 2021 in the Korean Intellectual Property Office, the disclosure of which is incorporated by reference herein in its entirety.

BACKGROUND

1. Field

The present disclosure relates to a nonvolatile memory device utilizing a variable resistance material.

2. Description of Related Art

As a semiconductor memory device, a nonvolatile memory device is a semiconductor memory device in which stored data is not destroyed even when the supply of power is stopped. Examples include programmable ROM (PROM), erasable PROM (EPROM), electrically EPROM (EEPROM), flash memory device, etc.

In recent years, in line with the demand for a technology that has high integration and low power characteristics and enables random access to memory cells, next-generation semiconductor memory devices, such as magnetic random access memory (MRAM) and phase-change random access memory (PRAM), have been developed.

These next-generation semiconductor memory devices employ resistance change elements that have resistance values that vary according to a current or voltage applied thereto, and maintain changed resistance values as they are even when the current or voltage supply is stopped. In order to implement high integration and low power, it may be required that resistance change characteristics of resistance change elements occur at a low applied voltage and have a wide resistance change range.

SUMMARY

Provided are variable resistance memory devices with improved variable resistance performance.

Additional aspects will be set forth in part in the description which follows and, in part, will be apparent from the description, or may be learned by practice of the presented embodiments of the disclosure.

According to an embodiment, a variable resistance memory device includes an insulating layer, a variable resistance layer on the insulating layer, a channel layer on the variable resistance layer, a gate insulating layer on the channel layer, and a plurality of gate electrodes on the gate insulating layer. The plurality of gate electrodes are spaced apart from each other. The variable resistance layer includes first to third oxide layers sequentially arranged on the insulating layer in. A dielectric constant of the second oxide layer is greater than a dielectric constant of the first oxide layer and a dielectric constant of the third oxide layer.

In some embodiments, a dielectric constant of the second oxide layer with respect to the dielectric constant of the first oxide layer or the third oxide layer may be equal to or greater than 1.5.

In some embodiments, the dielectric constant of the second oxide layer may be greater than or equal to 13.

In some embodiments, the dielectric constant of the first oxide layer or the dielectric constant of the third oxide layer may be greater than or equal to 7.

In some embodiments, a thickness of the second oxide layer may be less than or equal to a thickness of the first oxide layer.

In some embodiments, the second oxide layer may be less than or equal to three atomic layers.

In some embodiments, a thickness of the second oxide layer may be smallest among the first oxide layer, the second oxide layer, and the third oxide layer.

In some embodiments, a thickness of the second oxide layer may be less than or equal to 1 nm.

In some embodiments, a resistance ratio of a high resistive state to a low resistive state of the variable resistance layer may be greater than or equal to 2000 at 4V of a voltage difference between the plurality of gate electrodes.

In some embodiments, the first oxide layer and the third oxide layer may include a same material.

In some embodiments, at least one of the first oxide layer, the second oxide layer, and the third oxide layer may include zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), praseodymium (Pr), and silicon (Si).

In some embodiments, the second oxide layer may include at least one of $HfO_2$ and $ZrO_2$, and the first oxide layer may include $Al_2O_3$ and $CaO$.

In some embodiments, when a current flows through the variable resistance layer, a current density of the second oxide layer may be greater than a current density of the first oxide layer and a current density of the third oxide layer.

According to another embodiment, a variable resistance memory device includes a variable resistance layer, a first conductive element on the variable resistance layer, and a second conductive element on the variable resistance layer and spaced apart from the first conductive element. The variable resistance layer includes a first oxide layer, a second oxide layer, and a third oxide layer sequentially arranged in a direction perpendicular to a direction in which the first conductive element and the second conductive elements are arranged. A dielectric constant of the second oxide layer may be greater than a dielectric constant of the first oxide layer and a dielectric constant of the third oxide layer.

In some embodiments, a dielectric constant of the second oxide layer with respect to the dielectric constant of the first oxide layer or the dielectric constant of the third oxide layer may be greater than or equal to 1.5.

In some embodiments, the dielectric constant of the second oxide layer may be greater than or equal to 13, and the dielectric constant of the first oxide layer or the dielectric constant of the third oxide layer may be greater than or equal to 7.

In some embodiments, a thickness of the second oxide layer may be less than or equal to a thickness of the first oxide layer.

In some embodiments, the second oxide layer may be less than or equal to three atomic layers.

In some embodiments, a thickness of the second oxide layer may be smallest among the first oxide layer, the second oxide layer, and the third oxide layer.

According to an embodiment, a variable resistance memory device includes an a variable resistance layer, a plurality of gate electrodes and a plurality of insulators alternately and repeatedly arranged on the variable resistance layer, a gate insulating layer on the variable resistance layer, and a channel layer between the gate insulating layer and the variable resistance layer. The variable resistance layer may include a first oxide layer, a second oxide layer, and a third oxide layer sequentially arranged in a thickness direction of the variable resistance layer. A dielectric constant of the second oxide layer may be greater than a dielectric constant of the first oxide layer and a dielectric constant of the third oxide layer. The gate insulating layer may be between the variable resistance layer and the plurality of gate electrodes.

In some embodiments, at least one of the first oxide layer, the second oxide layer, and the third oxide layer may include zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), praseodymium (Pr), and silicon (Si).

In some embodiments, the second oxide layer may include at least one of $HfO_2$ and $ZrO_2$, and the first oxide layer may include at least one of $Al_2O_3$ and CaO.

In some embodiments, a thickness of the second oxide layer may be less than or equal to 1 nm.

In some embodiments, the first oxide layer and the third oxide layer may include a same material.

BRIEF DESCRIPTION OF THE DRAWINGS

The above and other aspects, features, and effects of certain embodiments of the disclosure will be more apparent from the following description taken in conjunction with the accompanying drawings, in which:

FIG. 7 is a table showing an on/off ratio of a variable resistance memory device when a voltage difference of a gate electrode is 4V;

DETAILED DESCRIPTION

Figure 1:
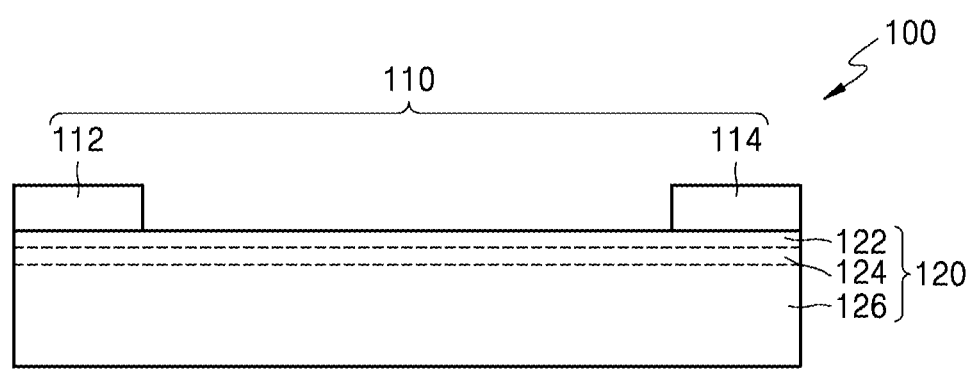
FIG. 1 is a cross-sectional view showing a schematic structure of a variable resistance memory device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, embodiments will be described in detail with reference to the accompanying drawings. The described embodiments are merely non-limiting examples, and various modifications are possible from these embodiments. In the following drawings, like reference numerals refer to like elements, and sizes of elements in the drawings may be exaggerated for clarity and convenience of description.

An expression "above" or "on" used herein may include not only "immediately on in a contact manner" but also "on in a non-contact manner" In other words, for example, it will be understood that when an element is referred to as being "on" another element, it can be directly on the other element or intervening elements may be present.

Terms such as "first" or "second" may be used to describe various elements, but the elements should not be limited by the terms. The terms do not define that the elements have different materials or structures from each other.

An expression used in the singular encompasses the expression of the plural, unless it has a clearly different meaning in the context. In addition, when an element "includes" or "comprises" an element, unless there is a particular description contrary thereto, the element can further include other elements, not excluding the other elements.

In addition, the terms such as " . . . unit" and "module" described herein mean units that process at least one function or operation, which may be implemented in hardware or software, or in a combination of hardware and software.

The term "the" and other demonstratives similar thereto should be understood to include a singular form and plural forms.

The operations of a method can be performed in any suitable order unless otherwise indicated herein or otherwise clearly contradicted by context. In addition, all example terms (e.g., "such as" or "etc.") are used for the purpose of description and are not intended to limit the scope of the present disclosure unless defined by the claims.

Figure 2:
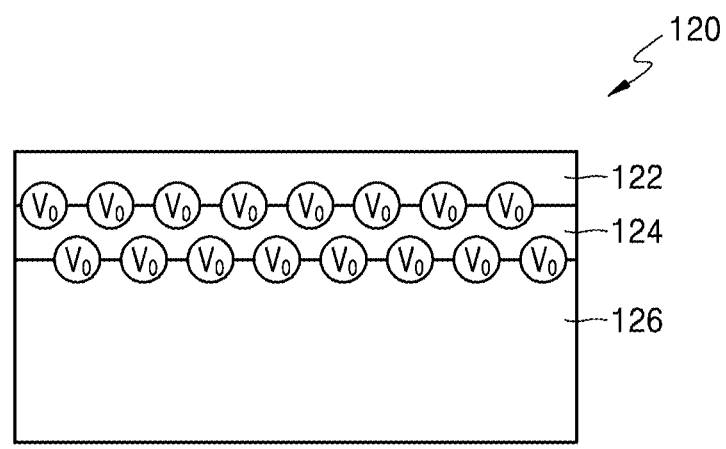
FIG. 2 is a conceptual diagram illustrating a principle of variable resistance occurring in a variable resistance layer provided in the variable resistance memory device of FIG. 1.

FIG. 1 is a cross-sectional view showing a schematic structure of a variable resistance memory device 100 according to an embodiment, and FIG. 2 is a conceptual diagram illustrating a principle of variable resistance occurring in a variable resistance layer 120 provided in the variable resistance memory device 100 of FIG. 1.

Referring to FIG. 1, the variable resistance memory device 100 may include the variable resistance layer 120 including first to third oxide layers 122, 124, and 126 sequentially arranged in a direction perpendicular to a direction in which first and second conductive elements 112 and 114 are spaced apart from each other.

The first conductive element 112 and the second conductive element 114 may be arranged on both ends of the variable resistance layer 120, and when a voltage is applied thereto, may be arranged to form a current path in a horizontal direction in the variable resistance layer 120, e.g., a direction in which the first to third oxide layers 122, 124, and 126 are arranged. The first conductive element 112 and the second conductive element 114 may be formed to contact both ends of the first oxide layer 122.

The variable resistance layer 120 may include the first oxide layer 122 having a first dielectric constant (where a dielectric constant of air is 1), the second oxide layer 124 having a second dielectric constant greater than the first dielectric constant, and the third oxide layer 126 having a third dielectric constant less than the second dielectric constant. That is, the second dielectric constant of the second oxide layer 124 may be greater than the first and third dielectric constants of the first and third oxide layers 122 and 126. The ratio of the second dielectric constant to the first or third dielectric constant may be equal to or greater than about 1.5. For example, the second dielectric constant of the second oxide layer 124 may be equal to or greater than 13, and at least one of the first and third dielectric constants of the first and third oxide layers 122 and 126 may be equal to or greater than 7.

The first oxide layer 122 and the third oxide layer 126 may have the same dielectric constant. For example, the first and third oxide layers 122 and 126 may include the same material.

The resistance characteristics of the variable resistance layer 120 may vary according to an applied voltage. The resistance characteristics of the variable resistance layer 120 depend on whether a conductive filament is formed by the movement of oxygen in the variable resistance layer 120 according to the voltage applied to the first conductive element 112 and the second conductive element 114 formed on the variable resistance layer 120. Depending on whether the conductive filament is formed, the variable resistance layer 120 may represent a low resistive state or a high resistive state, and accordingly, information of '1' or '0' may be recorded. The applied voltage that causes the variable resistance layer 120 to change from the high resistive state to the low resistive state is a set voltage $V_{set}$, and the applied voltage that causes the variable resistance layer 120 to change from the low resistive state to the high resistive state is a reset voltage $V_{reset}$. The variable resistance memory device 100 according to an embodiment proposes a configuration of the variable resistance layer 120 capable of implementing a low set voltage.

Referring to FIG. 2, a current flows between both ends of the variable resistance layer 120 by the applied voltage, and accordingly, oxygen vacancy $V_o$ and interstitial oxygen ions $O^{2-}$ are formed. The oxygen vacancy $V_o$ is collected to form the conductive filament, and the resistance of the variable resistance layer 120 is reduced by the conductive filament.

The conductive filament is well formed even at a low applied voltage, and the greater the difference in resistance between the low resistive state and the high resistive state generated by the applied voltage, the better the variable resistance performance. To this end, the oxygen vacancy $V_o$ needs to be well formed in the variable resistance layer 120.

As described above, when the variable resistance layer 120 includes a plurality of layers and a dielectric constant of a middle layer, that is, the second oxide layer 124 is high, if a voltage is applied to the variable resistance layer 120, a strong electric field may be formed in the second oxide layer 124 having a high dielectric constant in the variable resistance layer 120. A high electric field causes the movement of the oxygen vacancy $V_o$, and thus the oxygen vacancy $V_o$ is collected in the second oxide layer 124, an interface between the first oxide layer 122 and the second oxide layer 124, and an interface between the second oxide layer 124 and the third oxide layer 126 so that the conductive filament may be well formed.

When the variable resistance layer 120 is configured as described above, a desired resistance change range may be implemented with a lower thickness than that of a charge trap-based variable resistance device according to the related art or a variable resistance device using a phase change material.

In order to form the high electric field in the second oxide layer 124, the thickness of the second oxide layer 124 may be less than or equal to the thicknesses of the first and third oxide layers 122 and 126. The thickness of the second oxide layer 124 is the smallest, and the thicknesses of the second oxide layer 124 and the third oxide layer 126 may sequentially increase. For example, the second oxide layer 124 may have a thickness less than or equal to 3 layers of an atomic layer included in the second oxide layer 124. The second oxide layer 124 may be in a range of about 0.1 nm to about 1 nm and/or about 0.1 nm to about 2 nm and/or about 5 nm to about 2 nm.

The thickness of the second oxide layer 124 may be small so that the first oxide layer 122 may cause an electric field to be well formed in the second oxide layer 124 according to the voltage applied to the first and second conductive elements 112 and 114. However, because the electric field of the second oxide layer 124 needs to be formed better, the thickness of the first oxide layer 122 may be greater than or equal to the thickness of the second oxide layer 124. For example, the first oxide layer 122 may be in a range of about 0.5 nm to about 2 nm.

The thickness of the third oxide layer 126 may be large so that the electric field may be well formed in the second oxide layer 124. In addition, the thickness of the third oxide layer 126 may be large in order to minimize the introduction of noise from the outside through the third oxide layer 126. Thus, the thickness of the third oxide layer 126 may be greater than the thicknesses of the first and second oxide layers 122 and 124. For example, the third oxide layer 126 may be equal to or greater than about 5 nm (e.g., about 5 nm to about 25 nm).

The variable resistance layer 120 may include a semiconductor oxide or a metal oxide. For example, the variable resistance layer 120 may include an oxide of at least one element selected from the group consisting of zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), praseodymium (Pr) and silicon (Si). For example, the first to third oxide layers 122, 124, and 126 may be selected from $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Sc_2O_3$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, and $MnO_2$.

A dielectric constant of the oxide may vary depending on a manufacturing process. For example, a dielectric constant of $HfO_2$ may be about 13 to 25 depending on the manufacturing process, and a dielectric constant of $ZrO_2$ may be about 20 to 40 depending on the manufacturing process. In addition, a dielectric constant of $Al_2O_3$ may be about 7 to 13 depending on the manufacturing process, and a dielectric constant of $CaO$ may be about 3.7 to 16.2 depending on the manufacturing process. Therefore, when manufacturing the variable resistance layer 120, it may be necessary to check not only the material but also the dielectric constant.

In addition, because the dielectric constant varies according to the manufacturing process, the first to third oxide layers 122, 124, and 126 may include the same material having different dielectric constants. For example, the first oxide layer 122 and the third oxide layer 126 may adopt $Al_2O_3$ having a dielectric constant of 7, and the second oxide layer 124 may adopt $Al_2O_3$ having a dielectric constant of 13. Because the same material has the same or similar crystal structure, the variable resistance layer 120 may be easily formed.

The first oxide layer 122 may be formed in a material having a low dielectric constant, the second oxide layer 124 may be formed in a material having a relatively higher dielectric constant than that of the first oxide layer 122, and the third oxide layer 126 may be formed a material having a relatively lower dielectric constant than that of the second oxide layer 124. A difference in the dielectric constant between the first oxide layer 122 and the second oxide layer 124 may be set so that the conductive filament is well formed by the oxygen vacancy $V_o$. For example, the materials of the first oxide layer 122 and the second oxide layer 124 may be set so that the dielectric constant ratio of the second oxide layer 124 to the first oxide layer 122 is equal to or greater than 1.5. As the difference in dielectric constant increases, the electric field may concentrate on the second oxide layer 124. For example, the first oxide layer 122 may include at least one of $SiO_2$, $Al_2O_3$, and $CaO$, and the second oxide layer 124 may include at least one of $HfO_2$ and $ZrO_2$. Besides, the following combination may be employed.

In the present embodiment, the second oxide layer 124 including the material having a high dielectric constant is disposed in the middle, and the first oxide layer 122 and the third oxide layer 126 including the material having a low dielectric constant are disposed adjacent to both sides of the second oxide layer 124 so that the oxygen vacancy $V_o$ quickly moves through the second oxide layer 124, and thus the conductive filament may be more easily formed by the oxygen vacancy $V_o$.

Figure 3:
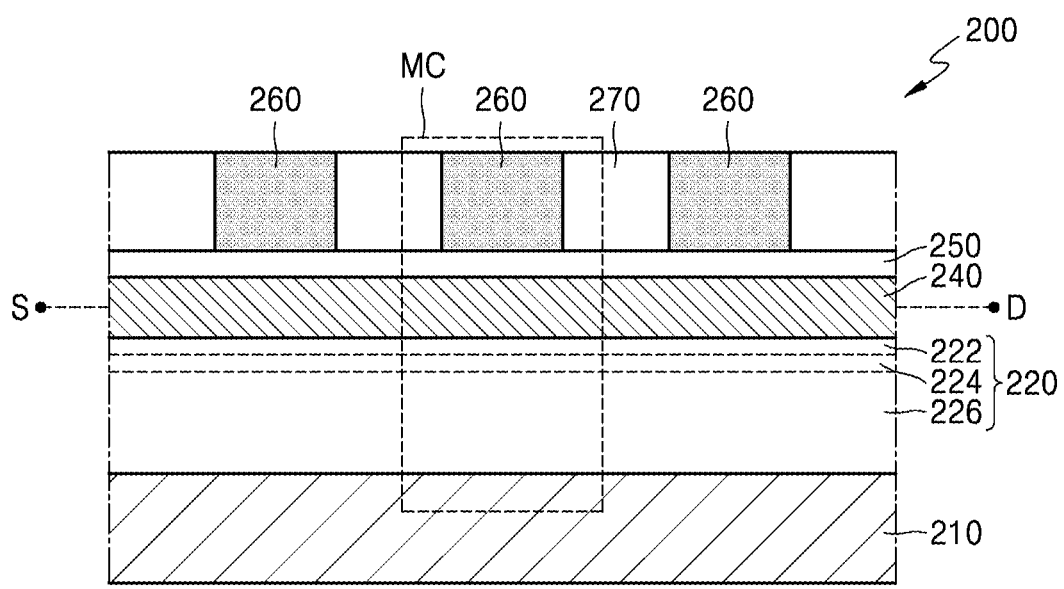
FIG. 3 is a cross-sectional view showing a schematic configuration of a variable resistance memory device according to another embodiment.
Figure 4:
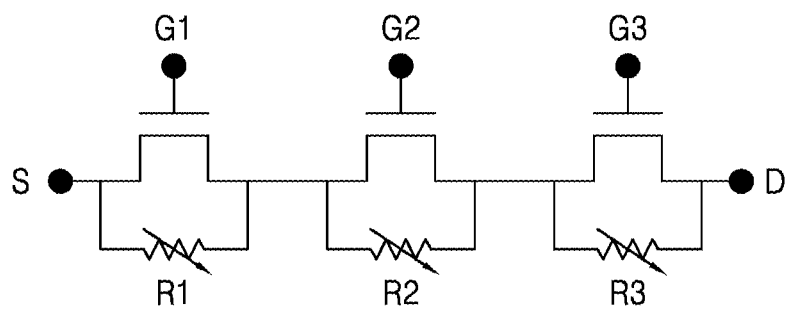
FIG. 4 is an equivalent circuit with respect to the variable resistance memory device of FIG. 3.

FIG. 3 is a cross-sectional view showing a schematic configuration of a variable resistance memory device 200 according to another embodiment, and FIG. 4 is an equivalent circuit with respect to the variable resistance memory device 200 of FIG. 3.

Referring to FIG. 3, the variable resistance memory device 200 includes an insulating layer 210, a variable resistance layer 220 disposed on the insulating layer 210, a channel layer 240 disposed on the variable resistance layer 220, a gate insulating layer 250 disposed on the channel layer 240, and a plurality of gate electrodes 260 formed on the gate insulating layer 250. Spaces between the plurality of gate electrodes 260 may be filled with the insulating layers 270. However, this is an example and the insulating layer 270 may be omitted.

The variable resistance layers 220 may include a first oxide layer 122 having a first dielectric constant (where a dielectric constant of air is 1), a second oxide layer 224 having a second dielectric constant greater than the first dielectric constant, and a third oxide layer 226 having a third dielectric constant less than the second dielectric constant which are sequentially arranged in one direction. That is, the second dielectric constant of the second oxide layer 224 may be greater than the first and third dielectric constants of the first and third oxide layers 222 and 226. The ratio of the second dielectric constant to the first or third dielectric constant may be equal to or greater than about 1.5. In addition, the first oxide layer 222 and the third oxide layer 226 may have the same dielectric constants. For example, the first and third oxide layers 222 and 226 may include the same material.

The material, characteristics, and thickness of the variable resistance layer 220 are substantially the same as those described with respect to the variable resistance layer 120 of FIG. 1. That is, because the second oxide layer 224 having a high dielectric constant in the center, and the first and third oxide layers 222 and 226 having a low dielectric constant are disposed in contact with the second oxide layer 224, an oxygen vacancy may move to the second oxide layer 224, an interface between the first oxide layer 222 and the second oxide layer 224, and an interface between the second oxide layer 224 and the third oxide layer 226 so that a conductive filament may be well formed.

The channel layer 240 may include a semiconductor material. The channel layer 240 may include, for example, poly-Si. A source electrode S and a drain electrode D may be connected to both ends of the channel layer 240.

The gate insulating layer 250 may include various types of insulating materials. For example, silicon oxide, silicon nitride, or silicon oxynitride may be used for the gate insulating layer 250.

A voltage turning on/off the channel layer 240 may be selectively applied to each of the plurality of gate electrodes 260.

The illustrated variable resistance memory device 200 has a structure including an array of a plurality of memory cells MC, and each memory cell MC includes a transistor and a variable resistor connected in parallel as shown in the equivalent circuit of FIG. 4. Each variable resistor is set by a voltage applied to a voltage applied to the gate electrode and a voltage between the source electrode S and the drain electrode D, and has a value corresponding to information of 1 or 0.

The operation of the variable resistance memory device 200 will be described with reference to FIG. 5.

When a memory cell to be recorded is selected, a gate voltage value of the cell is adjusted so that a channel is not formed in the selected cell, that is, the channel is turned off, and gate voltage values of unselected cells are adjusted so that the channel is turned on.

Figure 5:
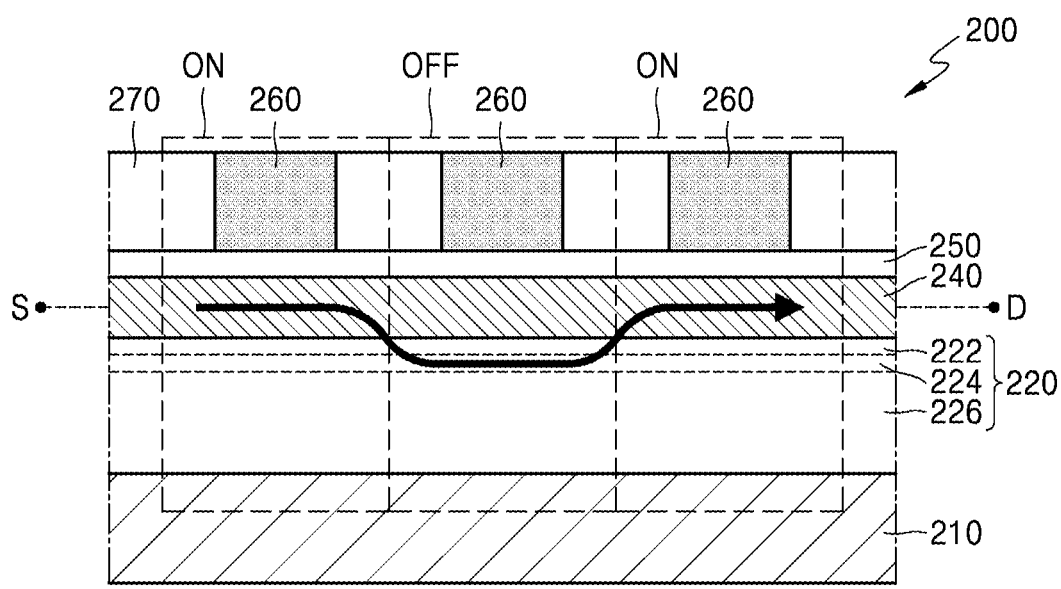
FIG. 5 is a diagram illustrating an operation of a variable resistance memory device.

FIG. 5 shows a case in which a gate voltage is applied to the gate electrode 260 of each cell so that a memory cell MC2 in the middle is turned off and two memory cells MC1 and MC2 on both sides thereof are turned on. When a voltage is applied between the source electrode S and the drain electrode D, a conduction path as shown by arrow A is formed. Desired information of 1 or 0 may be recorded on the selected memory cell MC2 by using the applied voltage $V_{set}$ or $V_{reset}$.

In a read operation, similarly, a read operation on the selected memory cell MC2 may be performed. That is, the gate voltage applied to each gate electrode 260 is adjusted so that the selected memory cell MC2 is in a channel-off state and the unselected memory cells MC1 and MC2 are in a channel-on state, and then a current flowing through the cell MC2 is measured by an applied voltage $V_{read}$ between the source electrode S and the drain electrodes D, and thus a cell state 1 or 0 may be checked.

IV characteristics of the variable resistance memory device are tested according to the material and thickness of the variable resistance layer. In Comparative Example 1, the variable resistance layer including $HfO_2$ having a thickness of 10 nm is used. In Comparative Example 2, the variable resistance layer including $Al_2O_3$ having a thickness of 10 nm is used. In Comparative Example 3, the variable resistance layer including $HfO_2$ having the thickness of 1 nm and $Al_2O_3$ having the thickness of 10 nm is used. In Embodiment 1, the variable resistance layer including $Al_2O_3$ having a thickness of 1 nm, $HfO_2$ having a thickness of 1 nm, and $Al_2O_3$ having the thickness of 10 nm is used. In Embodiment 2, the variable resistance layer including $Al_2O_3$ having a thickness of 1 nm, $HfO_2$ having a thickness of 0.5 nm, and $Al_2O_3$ having the thickness of 10 is used. Here, a dielectric constant of $Al_2O_3$ is about 10, and a dielectric constant of $HfO_2$ is about 18.

Figure 6A:
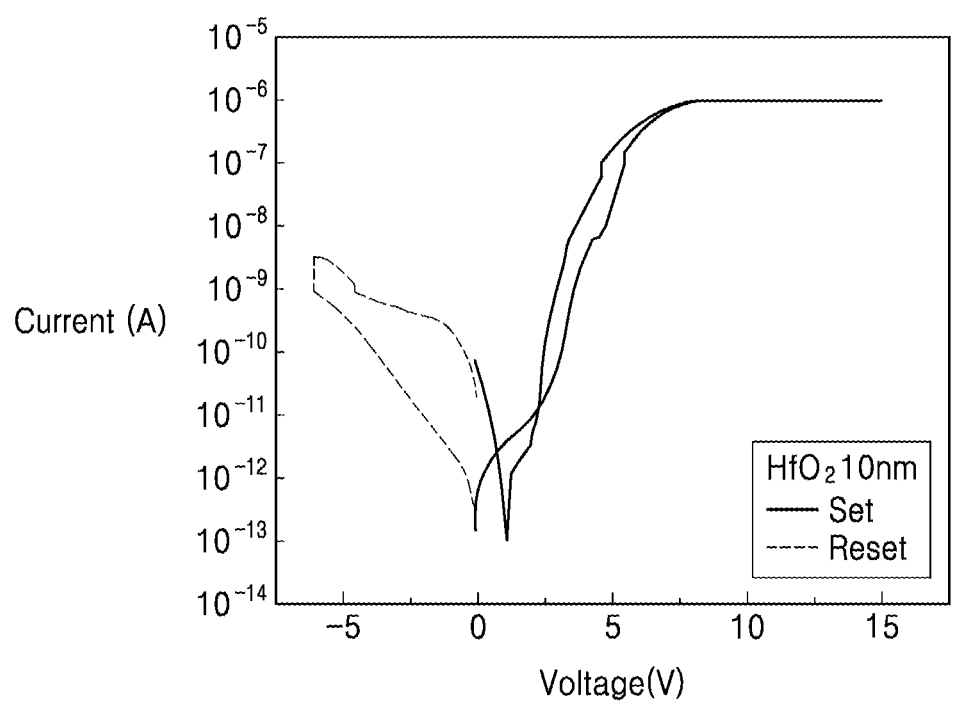
FIG. 6A is a diagram showing IV characteristics of a variable resistance memory device of Comparative Example 1.
Figure 6B:
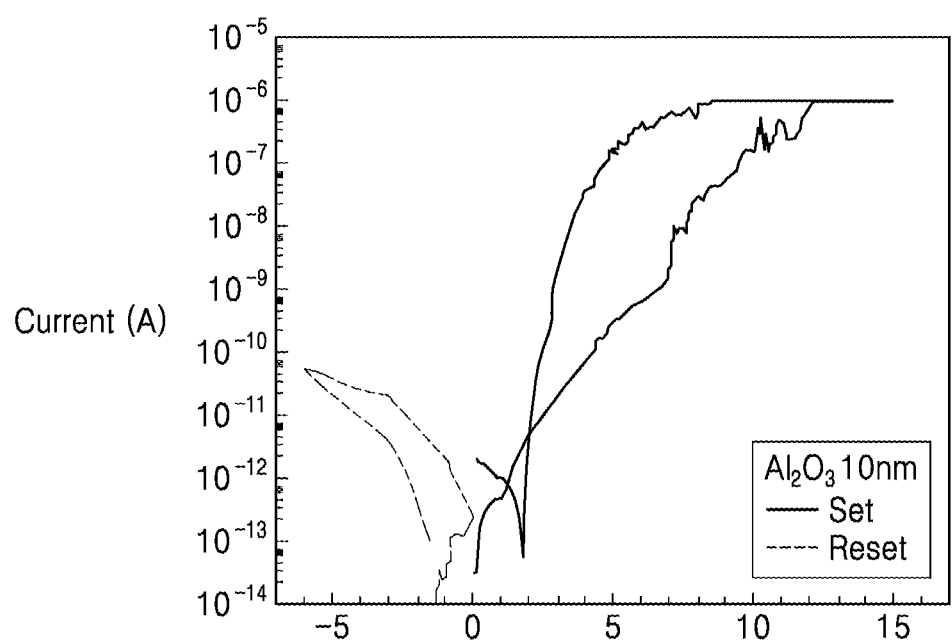
FIG. 6B is a diagram showing IV characteristics of a variable resistance memory device of Comparative Example 2.
Figure 6C:
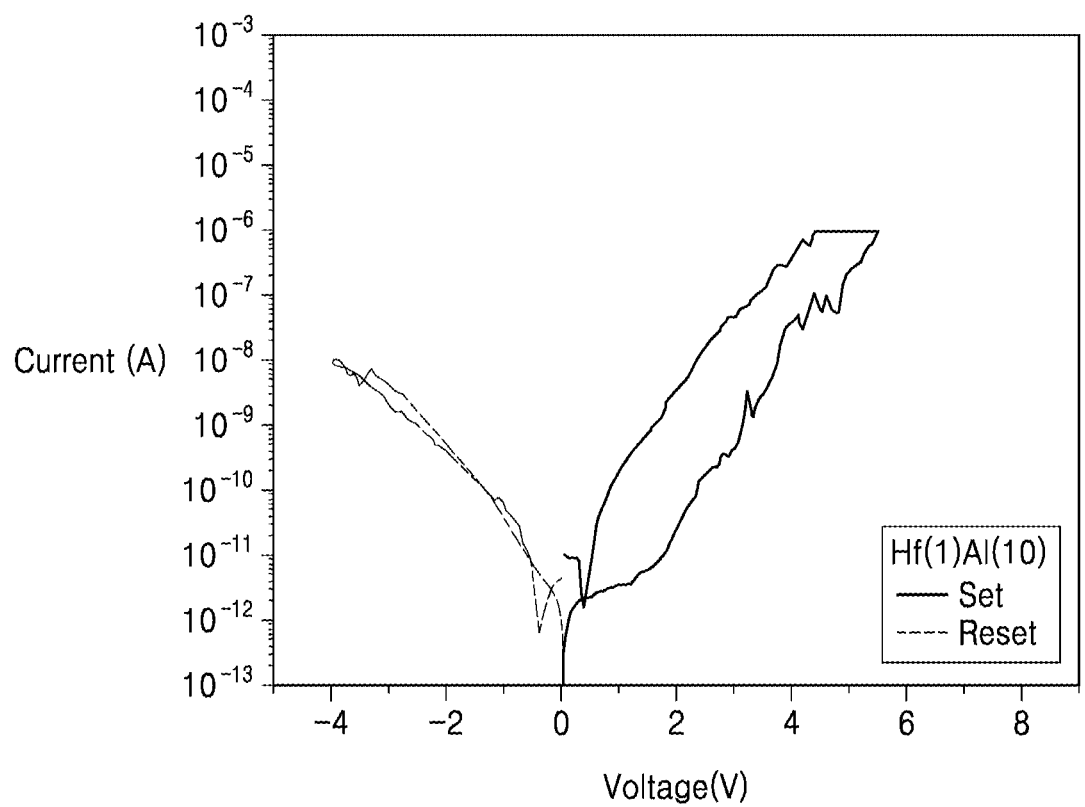
FIG. 6C is a diagram showing IV characteristics of a variable resistance memory device of Comparative Example 3.
Figure 6D:
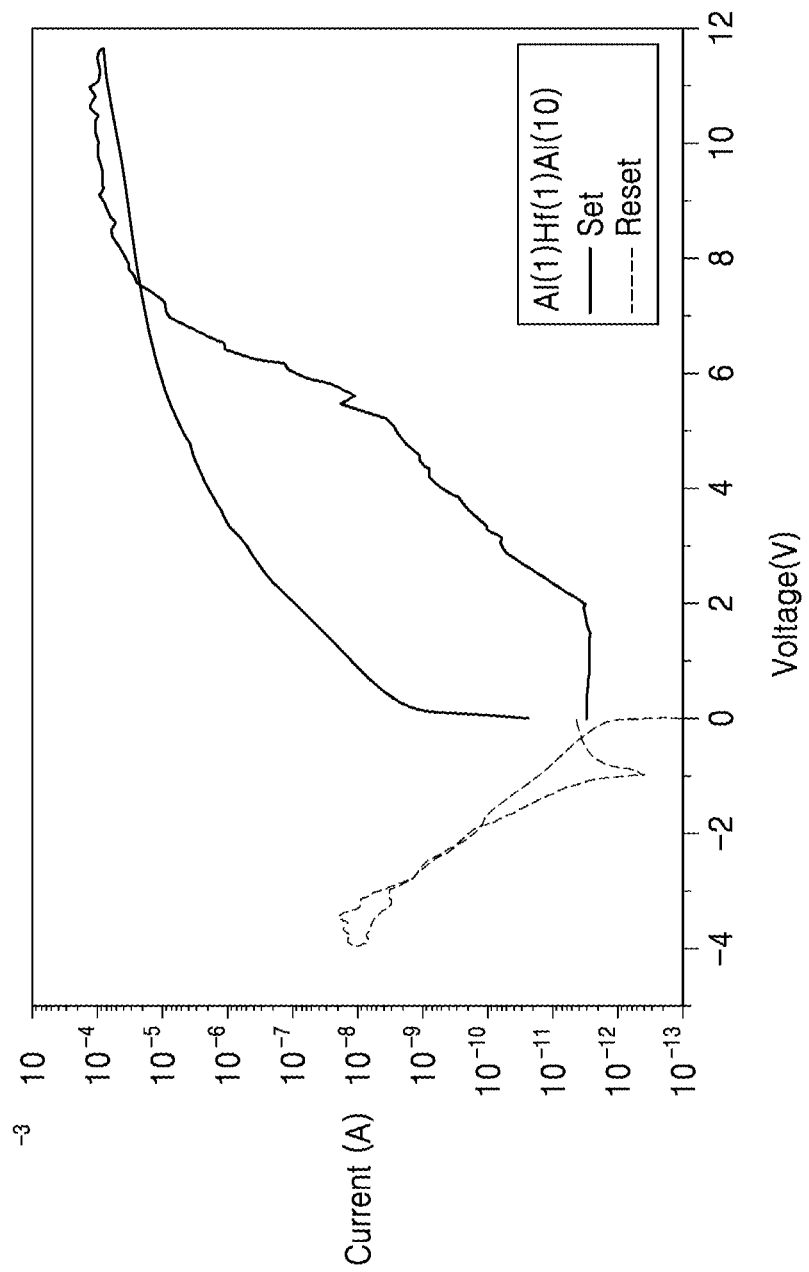
FIG. 6D is a diagram showing IV characteristics of a variable resistance memory device of Embodiment 1.
Figure 6E:
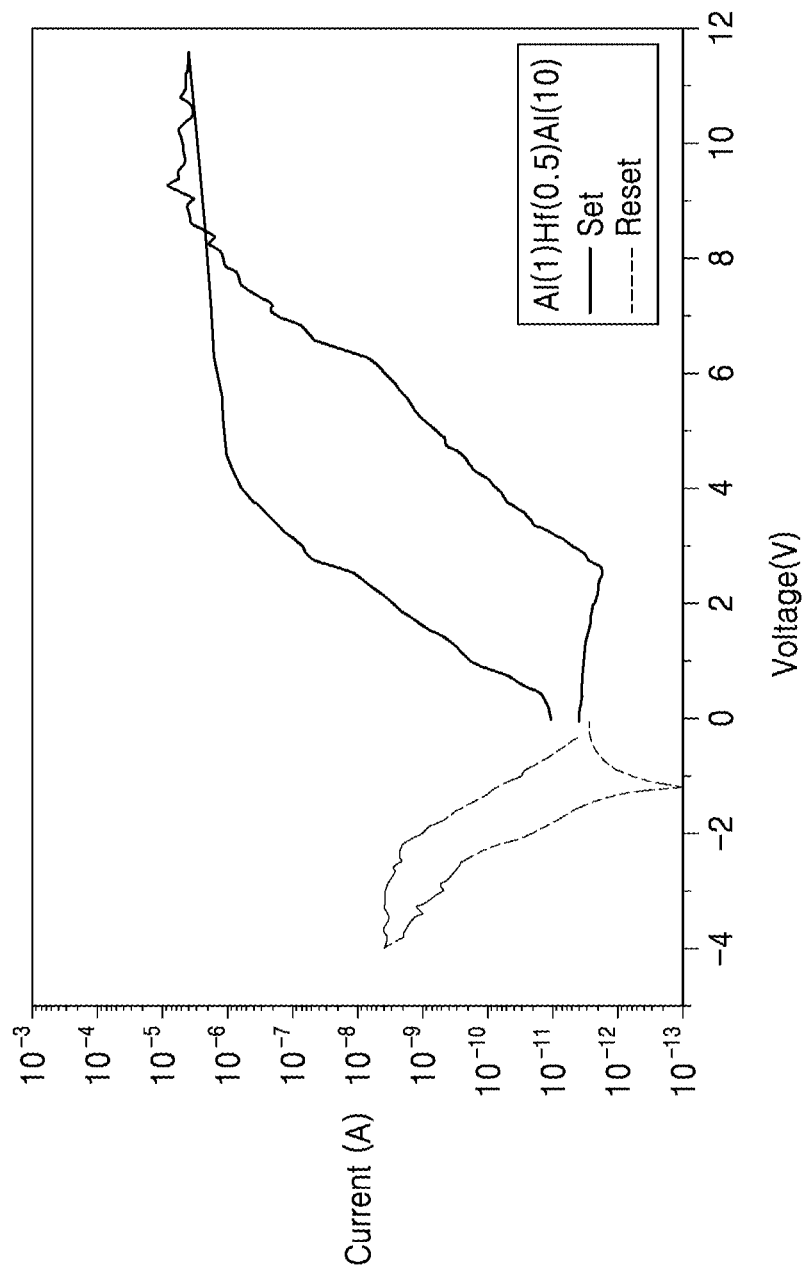
FIG. 6E is a diagram showing IV characteristics of a variable resistance memory device of Embodiment 2.

FIG. 6A is a diagram showing IV characteristics of a variable resistance memory device of Comparative Example 1, FIG. 6B is a diagram showing IV characteristics of a variable resistance memory device of Comparative Example 2, FIG. 6C is a diagram showing IV characteristics of a variable resistance memory device of Comparative Example 3, FIG. 6D is a diagram showing IV characteristics of a variable resistance memory device of Embodiment 1, and FIG. 6E is a diagram showing IV characteristics of a variable resistance memory device of Embodiment 2. FIG. 7 is a table showing an on/off ratio of a variable resistance memory device when a voltage difference of a gate electrode is 4V.

As shown in FIGS. 6A to 7, it may be seen that when the voltage difference between the gate electrode is 4V, the on/off ratio of the variable resistance memory device including $HfO_2$, that is, the resistance ratio of a high resistive state to a high resistive state of the variable resistance layer is about 6.5, and the on/off ratio of the variable resistance memory device including $Al_2O_3$ is about 500. It may be seen that when a plurality of variable resistance layers are used, for example, $HfO_2$ and $Al_2O_3$, the on/off ratio increases to about 1000. In addition, it may be seen that the on/off ratio of the variable resistance memory device in which $HfO_2$ having a large dielectric constant is disposed in the center and $Al_2O_3$ having a small dielectric constant is disposed on both sides significantly increases to about 2500. In addition, it may be seen that when the thickness of $HfO_2$ having the large dielectric constant is small, the on/off ratio of the variable resistance memory device is about 3600 and that the thinner the layer of a large dielectric constant, the greater the resistance ratio of the variable resistance layer to the low resistive state with respect to the high resistive state.

The variable resistance memory device of the present embodiment includes the variable resistance layer in which a second oxide layer including a material having a higher dielectric constant is disposed in the middle, and a first oxide layer and a third oxide layer including a material having a lower dielectric constant are disposed adjacent to both surfaces of the second oxide layer so that an oxygen vacancy concentrates in the second oxide layer and both interfaces of the second oxide layer, and thus a conductive filament may be more smoothly formed.

Figure 8:
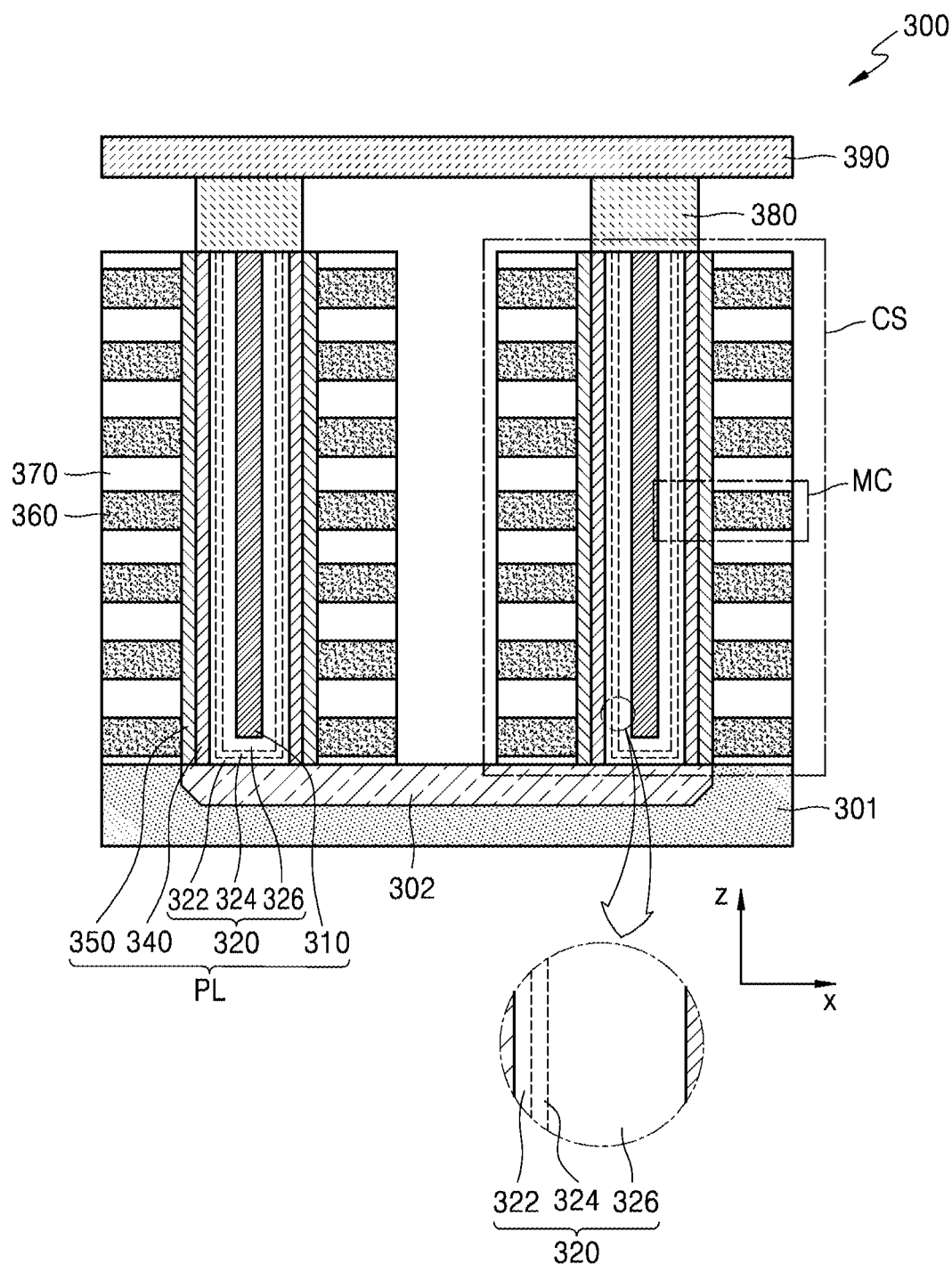
FIG. 8 is a cross-sectional view showing a schematic structure of a variable resistance memory device according to another embodiment.
Figure 9:
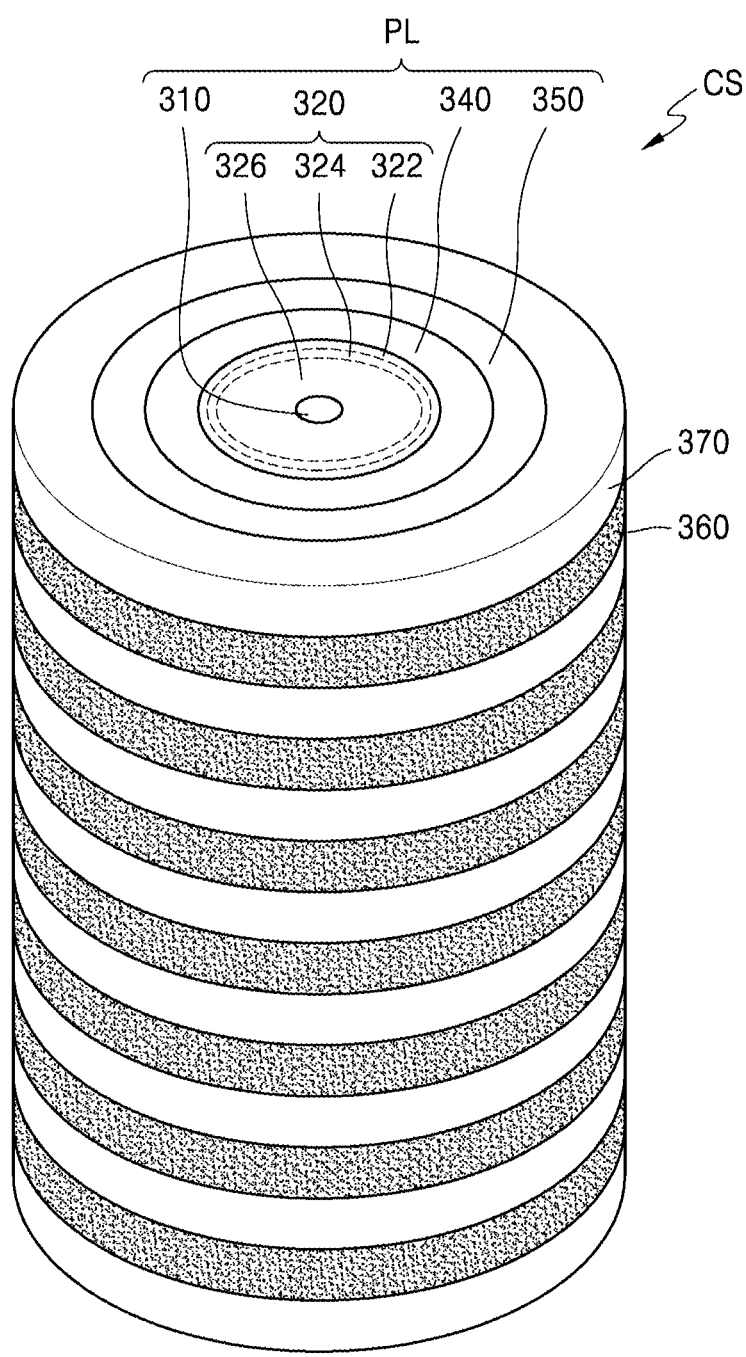
FIG. 9 is a perspective view showing a schematic structure of a memory string included in the variable resistance memory device of FIG. 8.

FIG. 8 is a cross-sectional view showing a schematic structure of a variable resistance memory device 300 according to another embodiment, and FIG. 9 is a perspective view showing a schematic structure of a memory string included in the variable resistance memory device 300 of FIG. 8. 10 is an equivalent circuit diagram of the variable resistance memory device 300 of FIG. 8.

The variable resistance memory device 300 according to the present embodiment is a vertical NAND (VNAND) memory in which the plurality of memory cells MC including a variable resistance material are vertically arrayed.

A detailed configuration of the variable resistance memory device 300 will be described below with reference to FIGS. 8 to 10.

First, referring to FIG. 8, a plurality of cell strings CS is formed on a substrate 301.

The substrate 301 may include a silicon material doped with a first type impurity. For example, the substrate 301 may include a silicon material doped with p-type impurity. For example, the substrate 301 may be a p-type well (e.g., a pocket p-well). Hereinafter, it is assumed that the substrate 301 is a p-type silicon. However, the substrate 301 is not limited to the p-type silicon.

A doping region 302 is provided on the substrate 301. For example, the doping region 302 will have a second type different from the substrate 301. For example, the doping region 302 may have an n-type. Hereinafter, it is assumed that the doping region 302 is the n-type. However, the doping region 302 is not limited to the n-type. The doping region 302 may be connected to a common source line CSL.

Figure 10:
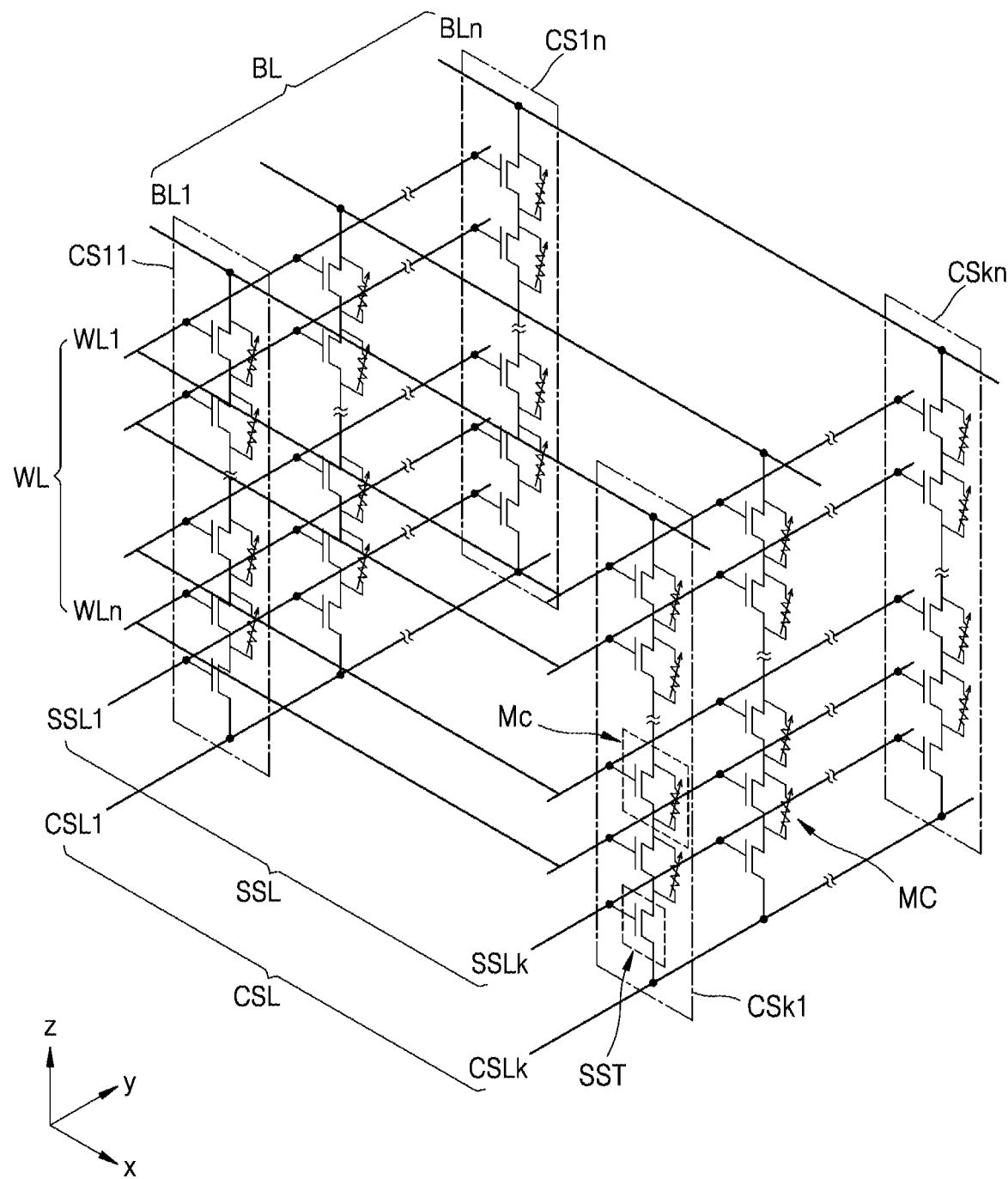
FIG. 10 is an equivalent circuit with respect to the variable resistance memory device of FIG. 8.

As shown in the circuit diagram of FIG. 10, k*n cell strings CS may be provided and arranged in the shape of a matrix, and may be named as CSij (1≤i≤k, 1≤j≤n) according to the position of each row and column. Each cell string CSij is connected to a bit line BL, a string selection line SSL, a word line WL, and the common source line CSL.

Each cell string CSij includes the memory cells MC and a string selection transistor SST. The memory cells MC and the string selection transistor SST of each cell string CSij may be stacked in a height direction.

Rows of the plurality of cell strings CS are connected to different string selection lines SSL1 to SSLk, respectively. For example, the string selection transistors SSTs of the cell strings CS11 to CS1n are commonly connected to the string selection line SSL1. The string selection transistors SST of the cell strings CSk1 to CSkn are commonly connected to the string selection line SSLk.

Columns of the plurality of cell strings CS are connected to different bit lines BL1 to BLn, respectively. For example, the memory cells MC of the cell strings CS11 to CSk1 and the string selection transistors SST may be commonly connected to the bit line BL1, and the memory cells MC and the string selection transistors SST of the cell strings CS1n to CSkn T may be commonly connected to the bit line BLn.

The rows of the plurality of cell strings CS may be connected to different common source lines CSL1 to CSLk, respectively. For example, the string selection transistors SST of the cell strings CS11 to CS1n may be commonly connected to the common source line CSL1, and the string selection transistors SST of the cell strings CSk1 to CSkn may be commonly connected to the common source line CSLk.

The memory cells MC positioned at the same height from the substrate 301 or the string selection transistors SST are commonly connected to one word line WL, and the memory cells MC positioned at different heights may be connected to the different word lines WL1 to WLm, respectively.

The illustrated circuit structure is an example. For example, the number of rows of the cell strings CS may increase or decrease. As the number of rows of the cell string CS changes, the number of string selection lines connected to the rows of the cell string CS and the number of cell strings CS connected to one bit line may also change. As the number of rows of the cell strings CS changes, the number of common source lines connected to the rows of the cell strings CS may also change.

The number of columns of the cell strings CS may increase or decrease. As the number of columns of the cell string CS changes, the number of bit lines connected to the columns of the cell strings CS and the number of cell strings CS connected to one string selection line may also change.

The height of the cell string CS may also increase or decrease. For example, the number of memory cells MC stacked on each cell string CS may increase or decrease. As the number of memory cells MC stacked on each cell string CS changes, the number of word lines WL may also change. For example, the number of string selection transistors provided to each of the cell strings CS may increase. As the number of string selection transistors provided to each of the cell strings CS changes, the number of string selection lines or common source lines may also change. When the number of string selection transistors increases, the string selection transistors may be stacked in the same shape as the memory cells MC.

For example, writing and reading may be performed in units of rows of the cell strings CS. The cell strings CS may be selected in units of one row by the common source line CSL, and the cell strings CS may be selected in units of one row by the string selection lines SSL. In addition, a voltage may be applied to the common source lines CSL in one unit of at least two common source lines CSL. A voltage may be applied to the common source lines CSL in one unit of all the common source lines CSL.

In a selected row of the cell strings CS, writing and reading may be performed in units of pages. The page may be one row of memory cells connected to one word line WL. In the selected row of the cell strings CSs, the memory cells MC may be selected in units of pages by the word lines WLs.

As shown in FIG. 9, the cell string CS includes a cylindrical pillar PL, a plurality of gate electrodes 360 surrounding the cylindrical pillar PL in a ring shape and a plurality of insulators 370. The plurality of gate electrodes 360 and the plurality of insulators 370 may be stacked to cross each other in a vertical direction (Z direction).

The gate electrode 360 may include a metal material or a silicon material doped at a high concentration. Each gate electrode 360 is connected to one of the word line WL and the string selection line SSL.

The insulator 370 may include various insulating materials such as silicon oxide and silicon nitride.

The pillar PL may include a plurality of layers. The outermost layer of the pillar PL may be a gate insulating layer 350. For example, the gate insulating layer 350 may include various insulating materials such as silicon oxide, silicon nitride, or silicon oxynitride. The gate insulating layer 350 may be conformally deposited on the pillar PL.

The channel layer 340 may be conformally deposited along the inner surface of the gate insulating layer 350. The channel layer 340 may include a semiconductor material doped in a first type. The channel layer 340 may include a silicon material doped in the same type as the substrate 301. For example, when the substrate 301 includes a silicon material doped in a p-type, the channel layer 340 may also include a p-type doped silicon material. Alternatively, the channel layer 340 may include a material such as Ge, IGZO, or GaAs.

The variable resistance layer 320 may be disposed along the inner surface of the channel layer 340. The variable resistance layer 320 may be disposed in contact with the channel layer 340 and may be conformally deposited on the channel layer 340.

At least one of the first oxide layer 122, the second oxide layer 124 and the third oxide layer 126 of the variable resistance layer 320 may include an oxide of at least one element selected from the group consisting of zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), praseodymium (Pr), and silicon (Si). For example, any one of $Rb_2O$, $TiO_2$, BaO, $ZrO_2$, CaO, $HfO_2$, SrO, $Sc_2O_3$, MgO, $Li_2O$, $Al_2O_3$, $SiO_2$, and BeO may be used. The variable resistance layer 320 may be substantially the same as the variable resistance layer 120 described in FIG. 1.

The variable resistance layer 320 ma include a second oxide layer 324 including a material having a high dielectric constant, and first and third oxide layers 322 and 326 having a relatively low dielectric constant on both sides of the second oxide layer 324. Accordingly, oxygen vacancy concentrates in the second oxide layer 224 and both interfaces of the second oxide layer 224 so that a conductive filament may be well formed, and thus the on/off ratio of the variable resistance memory device 300 may be equal to or greater than 2000.

An insulating layer 310 may be filled inside a resistance change layer 523.

The channel layer 340 and the variable resistance layer 320 may contact a doping region 302, that is, a common source region.

A drain 380 may be provided on the pillar PL. The drain 380 may include a second type doped silicon material. For example, the drain 380 may include an n-type doped silicon material.

A bit line 390 may be provided on the drain 380. The drain 380 and the bit line 550 may be connected through a contact plug.

Each of the gate electrodes 360 and the gate insulating layer 350, the channel layer 340, and the variable resistance layer 320 of positions facing the gate electrodes 360 in a horizontal direction (X direction) constitute the memory cell MC. That is, the memory cell MC has a circuit structure in which a transistor including the gate electrode 360, the gate insulating layer 350, and the channel layer 340 and a variable resistor by the variable resistance layer 320 are connected in parallel.

The parallel connection structure are successively arranged in a vertical direction (Z direction) to form the cell string CS. In addition, both ends of the cell string CS may be connected to the common source line CSL and the bit line BL as shown in the circuit diagram of FIG. 10. A voltage is applied to the common source line CSL and the bit line BL, and thus a program, read, or erase process may be performed on the plurality of memory cells MC.

For example, when the memory cell MC to be recorded is selected, a gate voltage value of the cell is adjusted so that a channel is not formed in the selected cell, that is, the channel is turned off, and gate voltage values of unselected cells are adjusted so that the channel is turned on. Accordingly, a current path by the voltage applied to the common source line CSL and the bit line BL passes through a region of the variable resistance layer 320 of the selected memory cell MC, and at this time, the applied voltage is set to $V_{set}$ or $V_{reset}$, which results in a low resistive state or a high resistive state, and desired information of 1 or 0 may be recorded on the selected memory cell MC.

In a read operation, similarly, a read operation on the selected memory cell MC may be performed. That is, the gate voltage applied to each gate electrode 360 is adjusted so that the selected memory cell MC is in a channel-off state and unselected memory cells are in a channel-on state, and then a current flowing through the cell MC is measured by the applied voltage $V_{read}$ between the common source line CSL and the bit line BL, and thus a cell state 1 or 0 may be checked.

As described above, the variable resistance memory device 300 according to the embodiments may be implemented by arraying the memory cells MC using the variable resistance layer 320 having a structure in which a conductive filament is easily formed by oxygen vacancy, thereby forming the variable resistance layer 320 having a small thickness compared to the structure of the related art, for example, a phase change material-based or charge trap-based memory device, and having a low operating voltage. The variable resistance memory device 300 may solve a scaling issue between memory cells in a next-generation VNAND, thereby increasing density and implementing low power.

The above-described variable resistance memory device may include a variable resistance layer having a large resistance ratio.

The above-described variable resistance memory device is easy to implement low power and high integration.

The variable resistance memory devices 100, 200, and 300 according to the present disclosure may be implemented in a memory block in the form of a chip and used in a memory system and/or used as a neuromorphic computing platform, or used to constitute a neural network.

Figure 11:
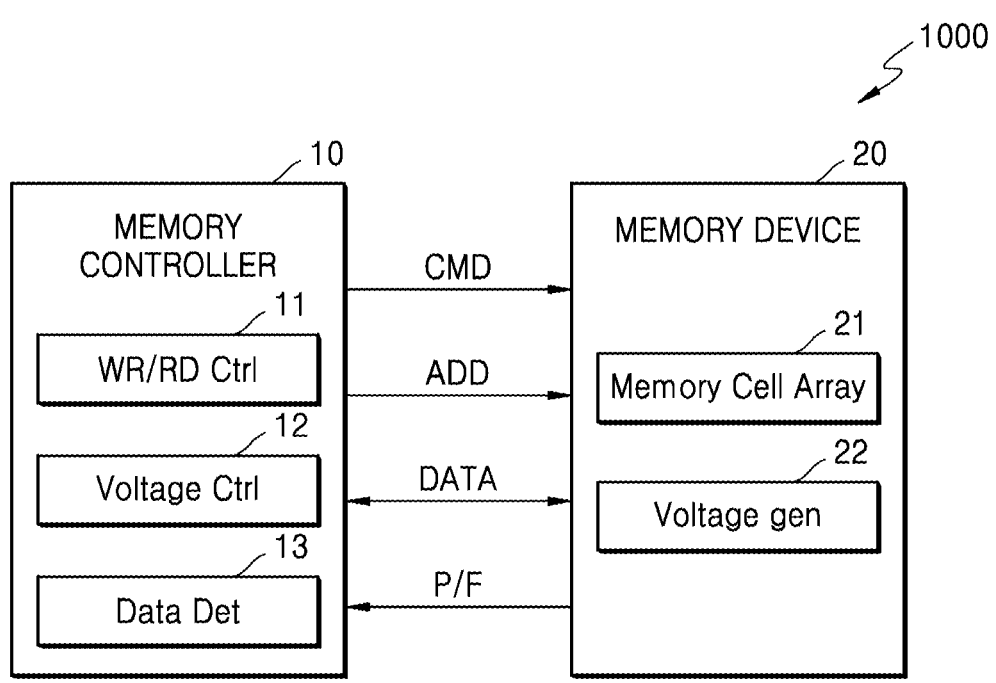
FIG. 11 is a block diagram of a memory system according to an embodiment.
Figure 12:
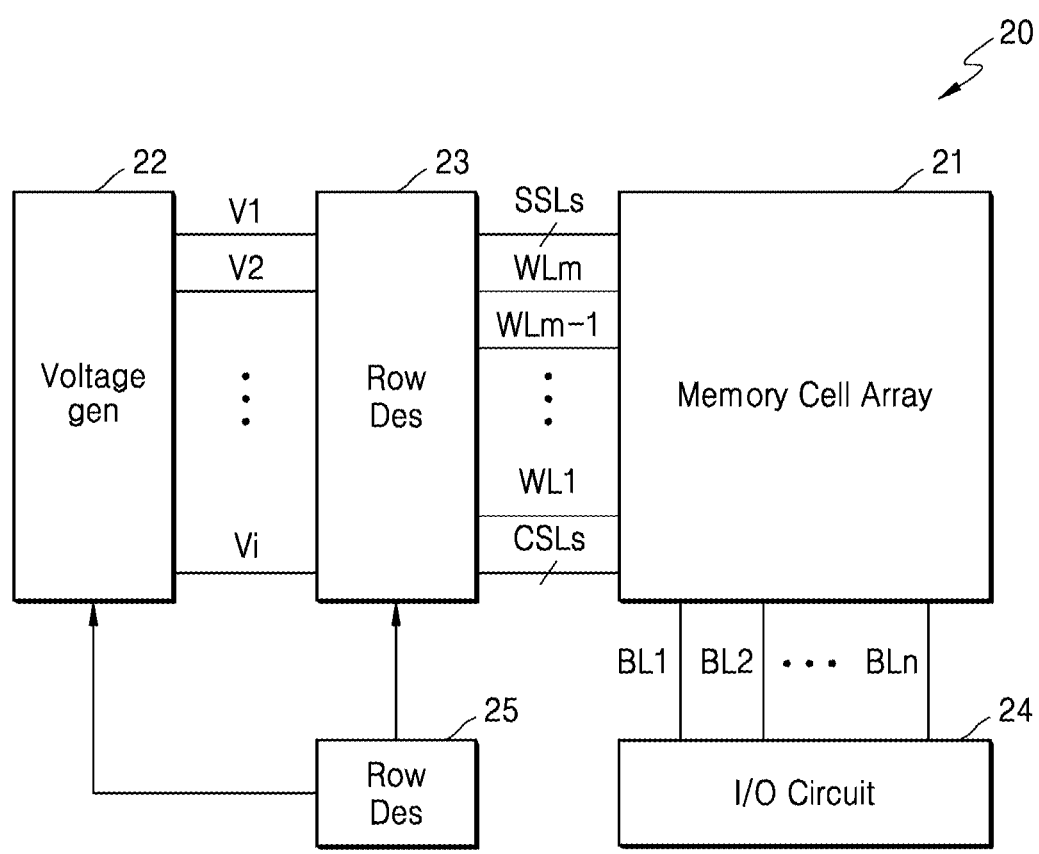
FIG. 12 is a block diagram of a memory device included in the memory system of FIG. 11, according to an embodiment.
Figure 13:
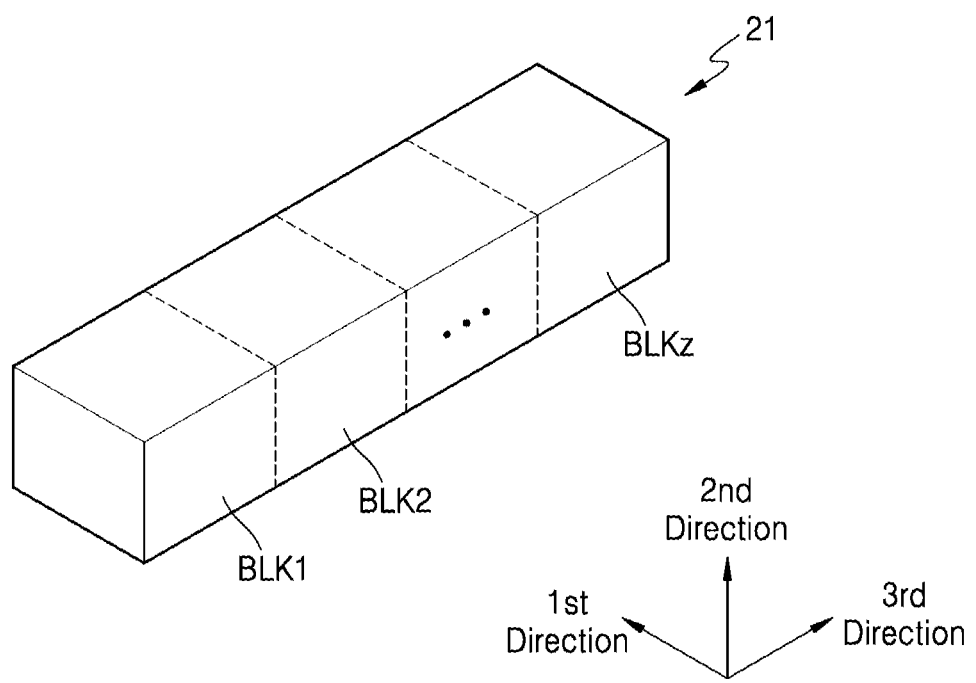
FIG. 13 is a block diagram of a memory cell array included in the memory system of FIG. 11.
Figure 14:
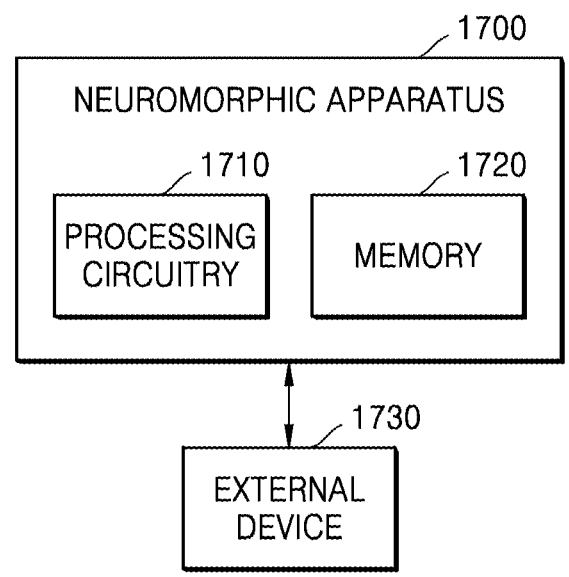
FIG. 14 is a block diagram of a neuromorphic apparatus and an external device connected thereto, according to an embodiment.

FIG. 11 is a block diagram of a memory system according to an embodiment. FIG. 12 is a block diagram of a memory device included in the memory system of FIG. 11, according to an embodiment. FIG. 13 is a block diagram of a memory cell array included in the memory system of FIG. 11. FIG. 14 is a block diagram of a neuromorphic apparatus and an external device connected thereto, according to an embodiment.

FIG. 11 is a block diagram of a memory system 1000 according to an embodiment. Referring to FIG. 11, the memory system 1000 may include a memory controller 10 and a memory device 20. The memory controller 10 may perform a control operation with respect to the memory device 20. For example, the memory controller 10 may provide an address ADD and a command CMD to the memory device 20 to perform a program (or write) operation, a read operation, and an erase operation on the memory device 20. Also, data for the program operation and data that is read may be exchanged between the memory controller 10 and the memory device 20.

The memory device 20 may include a memory cell array 21 and a voltage generator 22. The memory cell array 21 may include a plurality of memory cells arranged in areas in which a plurality of word lines and a plurality of bit lines cross each other. The memory cell array 21 may include memory cells realized as various shapes by including non-volatile memory cells for storing data in a nonvolatile way. The memory cell array 21 may include the variable resistance memory devices variable resistance memory devices 100, 200, and 300 according to embodiments of the present disclosure. The memory cell array 21 may include three-dimensional (or vertical) NAND memory cells.

The memory controller 10 may include a program/read controller 11, a voltage controller 12, and a data determiner 13.

The program/read controller 11 may generate an address ADD and a command CMD for performing program/read/erase operations on the memory cell array 21. Also, the voltage controller 12 may generate a voltage control signal for controlling at least one voltage level used in the nonvolatile memory device 20. For example, the voltage generator 12 may generate a voltage control signal for controlling a voltage level of a word line for reading data from the memory cell array 21 or programming data to the memory cell array 21.

The data determiner 13 may perform a determination operation with respect to the data read from the memory device 20. For example, by determining data read from the memory cells, the number of on cells and/or off cells from among the memory cells may be determined. The memory device 20 may provide a pass/fail (P/F) signal to the memory controller 10 according to a result of the determination respect to the read data. The data determiner 13 may control a write operation and a read operation on the memory cell array 21 by referring to the P/F signal. As an example of an operation, when a program operation is performed on the plurality of memory cells, states of data of the memory cells may be determined by using a predetermined read voltage, to determine whether or not the program operation is successfully completed with respect to all of the cells.

FIG. 12 is a block diagram of the memory device 20 included in the memory system 1000 of FIG. 11, according to an embodiment. Referring to FIG. 12, the memory device 20 may further include a row decoder 23, an input and output circuit 24, and a control logic 25.

The memory cell array 21 may be connected to one or more string selection lines SSL, a plurality of word lines WL1 through WLm, one or more common source lines CSLs, and a plurality of bit lines BL1 through BLn. A voltage generator 22 may generate one or more word line voltages V1 through Vi, and the one or more word line voltages V1 through Vi may be provided to a row decoder 23. A signal for program/read/erase operations may be applied to the memory cell array 21 through the bit lines BL1 through BLn.

Also, data to be programmed may be provided to the memory cell array 21 through the input and output circuit 24, and data that is read may be provided to the outside (for example, a memory controller) through the input and output circuit 24. The control logic 25 may provide various control signals related to a memory operation to the row decoder 23 and the voltage generator 22.

According to a decoding operation of the row decoder 23, the word line voltages V1 through Vi may be provided to various lines SSLs, WL1 through WLm, and CSLs. For example, the word lines voltages V1 through Vi may include a string selection voltage, a word line voltage, and ground selection voltages. The string selection voltage may be provided to one or more string selection lines SSLs, the word line voltage may be provided to one or more word lines WL1 through WLm, and the ground selection voltage may be provided to one or more common source lines CSLs.

FIG. 13 is a block diagram of the memory cell array 21 included in the memory system 1000 of FIG. 11. Referring to FIG. 13, the memory cell array 21 may include a plurality of memory blocks BLK1 through BLKz. Each memory block BLK may have a three-dimensional (or vertical) structure. For example, each memory block BLK may include structures extending in first through third directions. For example, each memory block BLK may include a plurality of memory cell strings extending in the second direction. Also, the plurality of memory cell strings may be two-dimensionally arranged in the first and third directions. Each memory cell string may be connected to the bit line BL, the string selection line SSL, the word lines WL, and the common source line CSL. Thus, each of the memory blocks BLK1 through BLKz may be connected to the plurality of bit lines BL, the plurality of string selection lines SSLs, the plurality of word lines WL, and the plurality of common source lines CSL. The memory blocks BLK1 through BLKz may be formed to have the equivalent circuit illustrated in FIG. 10.

FIG. 14 is a block diagram of a neuromorphic apparatus 1700 and an external device connected thereto, according to an embodiment.

Referring to FIG. 14, the neuromorphic apparatus 1700 may include processing circuitry 1710 and/or a memory 1720. The neuromorphic apparatus 1700 may include the variable resistance memory devices 100, 200, and 300 according to the embodiments of FIGS. 1, 3, 8, and 9.

In some embodiments, the processing circuitry 1710 may be configured to control functions of driving the neuromorphic apparatus 1700. For example, the processing circuitry 1710 may be configured to execute programs stored in the memory 1720 to control the neuromorphic apparatus 1700. In some embodiments, the processing circuitry 1710 may include hardware, such as a logic circuit, a hardware/software combination, such as a processor executing software, or a combination thereof. For example, the processor may include a CPU, a graphics processing unit (GPU), an application processor (AP) included in the neuromorphic apparatus 1700, an ALU, a digital signal processor, a microcomputer, a FPGA, an SoC, a programmable logic unit, a microprocessor, an ASIC, etc., but is not limited thereto. In some embodiments, the processing circuitry 1710 may be configured to read/write various data with respect to an external device 1730 and/or execute the neuromorphic apparatus 1700 by using the read/written data. In some embodiments, the external device 1730 may include an external memory having an image sensor (for example, a CMOS image sensor circuit) and/or a sensor array.

In some embodiments, the neuromorphic apparatus 1700 of FIG. 13 may be applied to a machine learning system. The machine learning system may include various artificial neural network organizations and processing models, such as a convolution neural network (CNN), a repeated neural network (RNN) selectively including a deconvolution neural network, a long short-term memory (LSTM) unit, and/or a gated recurrent unit (GRU), a stacked neural network (SNN), a state-space dynamic neural network (SSDNN), a deep faith network (DBN), a generative adversarial network (GAN), and/or a restricted Boltzmann machine (RBM).

Alternatively or additionally, the machine learning system may include: other types of machine learning models, for example, linear and/or logistic regression, statistics clustering, Bayesian classification, determination trees, dimensional reduction such as main component analyses, expert systems, and/or random forests; or a combination thereof. The machine learning models may be used to provide various services and/or applications. For example, an image classification service, a user authentication service based on biometric information or biometric data, an advanced driver assistance system (ADAS) service, a voice assistance service, an automatic speech recognition (ASR) service, etc. may be executed by an electronic device.

The variable resistance memory devices 100, 200, and 300 according to the embodiments are described above with reference to the drawings. However, they are only examples, and it would be understood by one of ordinary skill in the art that various modified and equivalent embodiments may be possible based the described examples. Various detailed configurations are described above. However, they should not limit the scope of the disclosure and should be interpreted as detailed examples of embodiments. Therefore, the scope of the disclosure should be defined by the technical concept described in the claims, rather than the embodiments described above.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. A variable resistance memory device comprising:
an insulating layer;
a variable resistance layer on the insulating layer;
a channel layer on the variable resistance layer;
a gate insulating layer on the channel layer; and
a plurality of gate electrodes on the gate insulating layer,
wherein the plurality of gate electrodes are spaced apart from each other,
wherein the variable resistance layer includes a first oxide layer, a second oxide layer, and a third oxide layer sequentially arranged on the insulating layer, and wherein a dielectric constant of the second oxide layer is greater than a dielectric constant of the first oxide layer and a dielectric constant of the third oxide layer.

2. The variable resistance memory device of claim 1, wherein
the dielectric constant of the second oxide layer with respect to the dielectric constant of the first oxide layer or the third oxide layer is greater than or equal to 1.5.

3. The variable resistance memory device of claim 1, wherein the dielectric constant of the second oxide layer is greater than or equal to 13.

4. The variable resistance memory device of claim 1, wherein the dielectric constant of the first oxide layer or the dielectric constant of the third oxide layer is greater than or equal to 7.

5. The variable resistance memory device of claim 1, wherein a thickness of the second oxide layer is less than or equal to a thickness of the first oxide layer.

6. The variable resistance memory device of claim 1, wherein a thickness of the second oxide layer is less than or equal to three atomic layers.

7. The variable resistance memory device of claim 1, wherein a thickness of the second oxide layer is smallest among thicknesses of the first oxide layer, the second oxide layer, and the third oxide layer.

8. The variable resistance memory device of claim 1, wherein a thickness of the second oxide layer is less than or equal to 1 nm.

9. The variable resistance memory device of claim 1, wherein a resistance ratio of a high resistive state to a low resistive state of the variable resistance layer is greater than or equal to 2000 at 4V of a voltage difference between the plurality of gate electrodes.

10. The variable resistance memory device of claim 1, wherein the first oxide layer and the third oxide layer include a same material.

11. The variable resistance memory device of claim 1, wherein at least one of the first oxide layer, the second oxide layer, and the third oxide layer comprises at least one material selected from the group consisting of zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), praseodymium (Pr), and silicon (Si).

12. The variable resistance memory device of claim 1, wherein the second oxide layer comprises at least one of $HfO_2$ and $ZrO_2$, and
wherein the first oxide layer comprises $Al_2O_3$ and CaO.

13. The variable resistance memory device of claim 1, wherein when a current flows through the variable resistance layer, a current density of the second oxide layer is greater than a current density of the first oxide layer and a current density of the third oxide layer.

14. A variable resistance memory device comprising:
a variable resistance layer;
a first conductive element on the variable resistance layer; and second conductive element on the variable resistance layer and spaced apart from the first conductive element, wherein
the variable resistance layer includes a first oxide layer, a second oxide layer, and a third oxide layer sequentially arranged in a direction perpendicular to a direction in which the first conductive element and the second conductive element are arranged, and
a dielectric constant of the second oxide layer is greater than a dielectric constant of the first oxide layer and a dielectric constant of the third oxide layer.

15. The variable resistance memory device of claim 14, wherein a dielectric constant ratio of the second oxide layer with respect to the dielectric constant of the first oxide layer or the dielectric constant of the third oxide layer is greater than or equal to 1.5.

16. The variable resistance memory device of claim 14, wherein the dielectric constant of the second oxide layer is greater than or equal to 13, and
the dielectric constant of the first oxide layer or the dielectric constant of the third oxide layer is greater than or equal to 7.

17. The variable resistance memory device of claim 14, wherein a thickness of the second oxide layer is less than or equal to a thickness of the first oxide layer.

18. The variable resistance memory device of claim 14, wherein a thickness of the second oxide layer is less than or equal to three atomic layers.

19. The variable resistance memory device of claim 14, wherein a thickness of the second oxide layer is smallest among thicknesses of the first oxide layer, the second oxide layer, and the third oxide layer.

20. The variable resistance memory device of claim 14, wherein the first oxide layer and the third oxide layer include a same material.

* * * * *